(12) United States Patent
Zhao

(10) Patent No.: US 9,671,641 B2
(45) Date of Patent: Jun. 6, 2017

(54) COLOR FILTER SUBSTRATE USED IN A DISPLAY AND ITS MANUFACTURING METHOD

(71) Applicant: Shenzhen China Star Optoelectronics Technology Co., Ltd., Shenzhen, Guangdong (CN)

(72) Inventor: Feng Zhao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 168 days.

(21) Appl. No.: 14/426,340

(22) PCT Filed: Dec. 30, 2014

(86) PCT No.: PCT/CN2014/095577
§ 371 (c)(1),
(2) Date: Mar. 5, 2015

(87) PCT Pub. No.: WO2016/095278
PCT Pub. Date: Jun. 23, 2016

(65) Prior Publication Data
US 2016/0342019 A1   Nov. 24, 2016

(30) Foreign Application Priority Data
Dec. 19, 2014   (CN) .......................... 2014 1 0798615

(51) Int. Cl.
*G02B 5/22*   (2006.01)
*G02F 1/1335*   (2006.01)
(Continued)

(52) U.S. Cl.
CPC ....... *G02F 1/133516* (2013.01); *G02B 5/201* (2013.01); *G02B 5/22* (2013.01);
(Continued)

(58) Field of Classification Search
CPC .......... G02F 2001/13625; G02F 2001/133514; G02F 2001/136236; G02F 2001/133519;
(Continued)

(56) References Cited

U.S. PATENT DOCUMENTS 5,945,256 A * 8/1999 Kim ...................... G02F 1/1362
430/312
2013/0334507 A1* 12/2013 Shimoji ................... F21V 9/08
257/40
2015/0331279 A1* 11/2015 Kimura .................. G02B 5/201
349/42

\* cited by examiner

*Primary Examiner* — Bumsuk Won
*Assistant Examiner* — Collin X Beatty
(74) *Attorney, Agent, or Firm* — Andrew C. Cheng

(57) ABSTRACT

A color filter substrate used in a display and the method thereby, and the photo mask of the color filter substrate are disclosed. The color filter substrate comprises a main body and a plurality color resist patterns on the main body. The adjacent color resist patterns partially overlap wherein in the overlapping region, the thickness of bottom color resist pattern is gradually thinning in its edge direction. Through the above way, the horn section in the overlapping region of the adjacent RGB color resist patterns of the color filter substrate is reduced. The performance of the liquid crystals is improved. Moreover, the OC flat layer does not need to be built on RGB the color resist pattern. The production cost of the liquid crystal display device is reduced and the productivity is improved.

8 Claims, 3 Drawing Sheets

(51) Int. Cl.
    *G02B 5/20*  (2006.01)
    *G03F 7/00*  (2006.01)
    *G03F 7/20*  (2006.01)
    *G03F 7/32*  (2006.01)
(52) U.S. Cl.
    CPC ...... *G02F 1/133514* (2013.01); *G03F 7/0007* (2013.01); *G03F 7/20* (2013.01); *G03F 7/32* (2013.01); *G02F 2001/133519* (2013.01)
(58) Field of Classification Search
    CPC ............... G02F 1/133512; G02F 1/144; G02F 2201/123; G02F 1/133513; G03F 7/2022; G03F 7/70458; G03F 7/70791; G03F 7/0007; G03F 7/0035; G03F 7/70283; G03F 7/70291; G03F 7/70466; G02B 5/22
    USPC ........... 349/106; 430/312, 321, 20; 359/891, 359/890
    See application file for complete search history.

COLOR FILTER SUBSTRATE USED IN A DISPLAY AND ITS MANUFACTURING METHOD

FIELD OF THE INVENTION

The present invention relates to a technical field of a liquid crystal display device; in particular, to a color filter substrate used in a display and its manufacturing method and a photo mask of the color filter substrate.

BACKGROUND OF THE INVENTION

A TFT-LCD panel comprises an array substrate, a color filter substrate and a liquid crystal disposed between the array substrate and the color filter substrate. The liquid crystal molecules is driven by the electric field generated from the circuit. Full color display images are achieve by the optical effects from the physical characteristics of the liquid crystals relative to the RGB three colors variation on the color filter substrate.

The color filer substrate is a main component for colorization of the TFT-LCD panel. It usually comprises a pixel filter membrane and a black array layer wherein the pixel filter membrane comprises red, green and blue three color pixel filter films arranged in a predetermined structure on the transparent glass substrate. Because the traditional RGB pixel photo mask which does not have any special patterning mean is whole transmission area. After the R□G□B yellow light process, the different color resists of the RGB three color pixel filter film exit in the overlapping area, and the horn section caused from the serious color resist stacking is formed between the overlapping regions. The horn section of the serious color resist stacking makes the topography near the color filter substrate be undulating and it affects the oblique of the surrounding liquid crystals. The performance of the liquid crystals is low. Therefore, an OC flat layer has to be coated on the RGB pixel filter film. The material cost increases, the process period extends and the productivity is low.

SUMMARY OF THE INVENTION

In view of this, the present invention provides a color filter substrate used in a display and its manufacturing method and the photo mask of the color filter substrate to improve the performance of the liquid crystal without adding the OC flat layer to manufacturing the color filter substrate. The manufacturing processes are simple with high productivity. which the color filter substrate comprises a main body and a plurality of color resist Further, the thickness of the bottom color resist pattern is an arc transition in an edge of the color resist pattern.

The present invention provides the manufacturing method of the color filter substrate used in a display, which the manufacturing method comprises: providing a main body; coating a color resist layer on the main body; exposing a color resist layer by a photo mask, wherein the photo mask comprises a light shielding region and a transmission region surrounded by the light shielding area, and a spaced shading pattern being disposed in an edge of the light shielding region near the transmission region to form a semi-transparent gray scale mask area; developing the color resist layer after exposing to obtain a color resist pattern, wherein thickness of the color resist pattern corresponding to the gray scale mask area is thinning in an edge direction of the color resist pattern.

Further, the gray scale mask area is disposed in opposite sides of the light shielding region to make thickness of the opposite sides of the color resist pattern corresponding to the gray scale mask area be thinning in an direction of the color resistor pattern.

I Further, he gray scale mask area is disposed at a surrounding area of the light shielding area, to make thickness of an surrounding area of the color resist pattern corresponding to the gray scale mask area be thinning in an direction of the color resist pattern.

Further, the shading pattern is a rectangular shape, a triangular shape, a trapezoidal shape or a semicircular shape.

The present invention provides a photo mask of a color filter substrate, wherein the photo mask comprises a light shielding region and a transmission region surrounded by the light shielding region, a spaced shading pattern being disposed in an edge of the light shielding region near the transmission region to form a semi-transparent gray scale mask area.

Further, the semi-transparent gray scale mask area is disposed at opposite sides of the light shielding region.

Further, the semi-transparent gray scale mask area is disposed at a surrounding area of the light shielding region.

Further, the shading pattern is a rectangular shape, a triangular shape, a trapezoidal shape or a semicircular shape.

Through the above solution, the advantage of the present invention:

Comparing with the traditional art, a color filter substrate used in a display and the manufacturing method therein, and the photo mask of the color filter substrate are disclosed. The color filter substrate comprises a main body and a plurality color resist patterns on the main body. The adjacent color resist patterns partially overlap wherein in the overlapping region, the thickness of the bottom color resist pattern is gradually thinning in its edge direction. The horn section in the overlapping region of the color resist pattern is reduced. The OC flat layer does not need to be laid on the color resist pattern, but the surface of the color filter substrate keeps flat. Moreover, the photo mask of the color filter substrate of the present invention used in the display comprises the light shielding region and the transmission region surrounded by the light shielding region. The spaced shading pattern is disposed at the edge area of the light shielding region near the transmission region of form a semi-transparent gray scale mask area. The color resist layer on the main body of the color filter substrate is exposed and then developed after exposed to obtain the color resist pattern of which the thickness of the area relative to the gray scale photo mask area is gradually thinning in its edge direction. The manufacturing process of the OC flat layer is eliminated because it has already had the patterning process on the color filter substrate. The color filter substrate is flat, the liquid crystal performance is improved, the production cost for the liquid crystal display panel is reduce, and the productivity is improved.

DETAILED DESCRIPTION OF THE PREFERRED EMBODIMENTS

Below with reference to the accompanying drawings and examples further illustrate the present invention patent.

Figure 1:
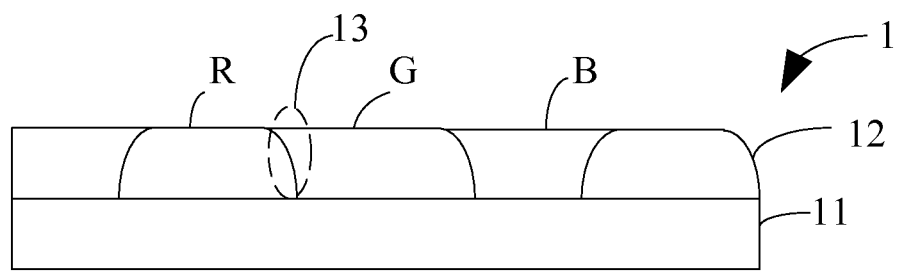
FIG. 1 is a schematic structural diagram of the present invention used for the display of the color filter substrate.

Please refer to FIG. 1. FIG. 1 is a schematic structural diagram of the present invention used for the display of the color filter substrate. As shown in FIG. 1, a color filter substrate 1 discloses by the embodiment of the present invention used in a display comprises a main body 11 and a plurality of color resist patterns 12 disposed on the main body. The color resist patterns 12 means a pixel filter film used in light filtering and relative to one pixel. The color resist patterns 12 usually comprises a red resist pattern R, a green resist pattern G, and a blue resist pattern B. Otherwise, the color resist pattern 12 comprises the color resist pattern with over three colors combination or other color resistor pattern.

Figure 2:
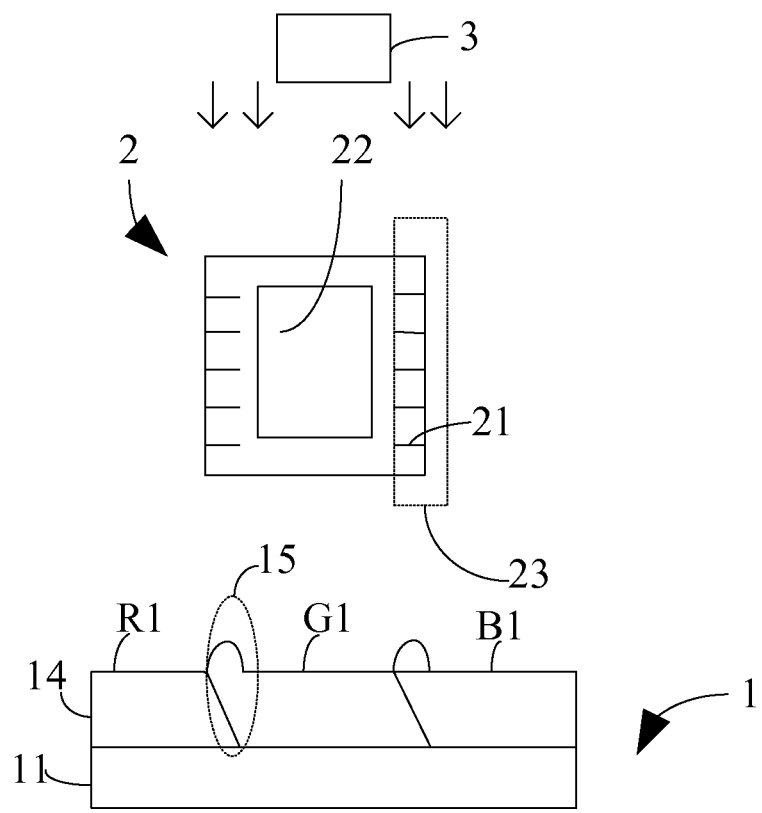
FIG. 2 is a process schematic diagram of a color filter substrate of the present invention.
Figure 3:
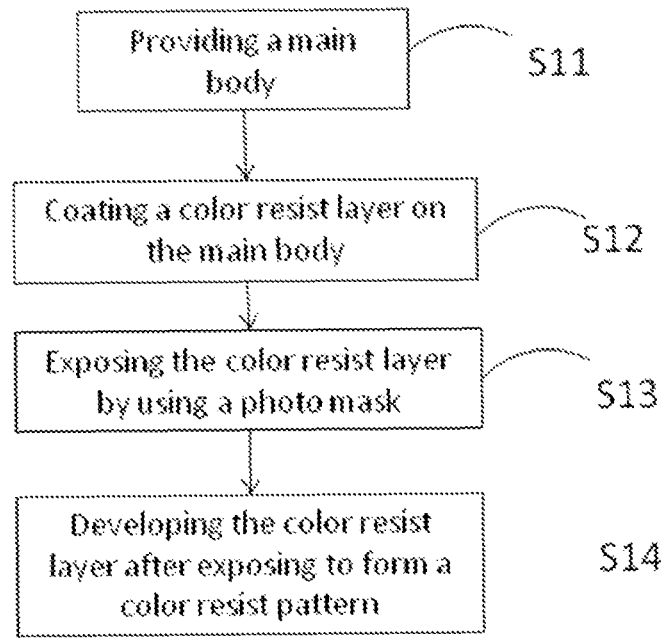
FIG. 3 is a flow chart of a manufacturing method of a color filter substrate of the present invention.

In present embodiment, the adjacent color resist patterns 12 partially overlap to each other, where the thickness of the bottom color resistor region 12 in the overlapping region is thinning in the edge direction. For example, an overlapping region is between the red resist pattern R and the green resist pattern G. Moreover, the red resist pattern R is located in the bottom of the overlapping region. The thickness of the red resist pattern R is gradually thinning in its edge direction, thickness of the red resist pattern R in its edge direction appears an arc transition. Please refer to FIG. 2 and FIG. 3. FIG. 2 is a schematic diagram of one embodiment of an array substrate of the present invention. FIG. 3 is a schematic diagram of another embodiment of an array substrate of the present invention.

Comparing with the conventional art, the horn section 12 of the overlapping region 13 between the adjacent color resist patterns 12 of the color filter substrate disclosed by the present embodiment used in the display is smaller, or it does not even exit. The present invention improves the performance of the liquid crystal. Furthermore, the color filter 1 does not need to add an OC flat layer on the color resist pattern 12 in order to reduce the horn section of the overlapping region 13. The manufacturing process for the color filter substrate is simple and the production cost for the liquid crystal panel is reduced.

Please refer to FIG. 2. FIG. 2 is a schematic diagram of a production process of the color filter substrate of the present invention. It should be emphasized that a place status of a color filter substrate 1, a photo mask 2, and a light source shown in FIG. 2, the structure and condition of the elements of the color filter 1 does not appear at the same process stage of the actual production at the same time. FIG. 2 shows the structure and condition of the color filter substrate 1 in the different process stages in order to explain it conveniently. As shown in FIG. 2, the color filter substrate 1 comprises a main body 11 and a color resist layer 14 where a block array layer (not shown in figures) and the color resist layer 14 is disposed on the main body with the black array layer. The schematic diagram of the production process further comprises a mask 2 and a light source 3.

Combining with FIG. 2, please see FIG. 3. FIG. 3 is a flow chart of a manufacturing method of the color filter substrate of the present invention. As shown in FIG. 3, the manufacturing method of the color filter substrate 1 disclosed by the present embodiment comprises:

S11: Providing a main body 11, where the main body 11 is a transmission glass substrate. First, initially clean the glass substrate. Here, the initial cleaning is to put the glass substrate into the cleaning tank. The dusts and impurities are removed from the glass substrate by the chemical or physical methods to prevent the dust or impurities on affecting the subsequent manufacturing processes. And sputter chromium on the glass substrate after cleaning to enhance the performance of the glass substrate.

S12: coating a color resist layer 14 on the main body. The present embodiment forms a black array layer by using the method of the photo resist coating, exposing, developing, etching and the photo resist removing on the main body 11, i.e. a glass substrate. And then the RGB color resist layer is formed on the glass substrate with the black array layer by using the method of the photo resist coating, exposing and developing, where a red resist layer R1, a green resist layer G1 and a blue resist layer B1 are formed by the method of the photo resist coating, exposing and developing. The arbitrary adjacent color resist layers 14 partially overlap to form an overlapping region 15.

Figure 4:
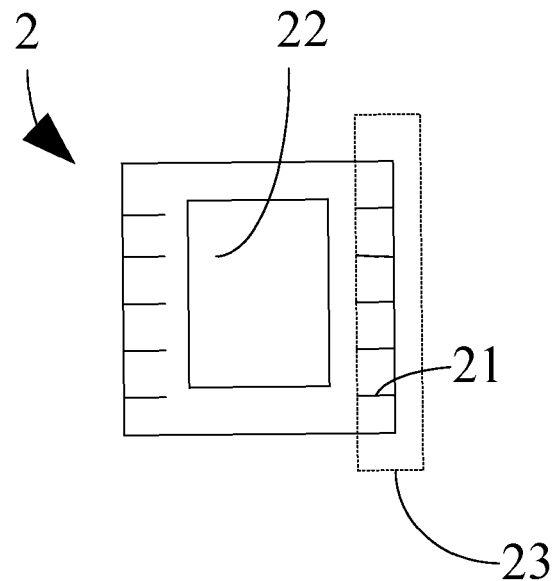
FIG. 4 is a schematic structural diagram showing a photo mask of a color filter substrate based on a first embodiment of the present invention.

S13: Exposing the color resist layer 14 by using a photo mask 2, where the photo mask 2 of a color filter substrate 1 is shown in FIG. 4. FIG. 4 is a schematic structural diagram showing a photo mask of a color filter substrate based on a first embodiment of the present invention. Please refer to FIG. 4. The photo mask 2 comprises a light shielding region 21 and a transmission area 22 surrounded by the light shielding region 21. A spaced shading pattern is disposed in an edge of the light shielding region 21 near the transmission region 22 to form a semi-transparent gray scale mask area 23, where the gray scale mask area 23 is disposed at the opposite sides of the light shielding region 21. The shape of the shading pattern is rectangle, triangle, trapezoid or semicircular. Otherwise, the shading pattern can further be other regular or irregular morphology such as a zigzagged shape, an arc shape or a trapezoidal shape to achieve the semitransparent characteristic by using the patterning process in the edge of the photo mask. FIG. 4 is the example of the rectangular shape for the present invention.

Figure 5:
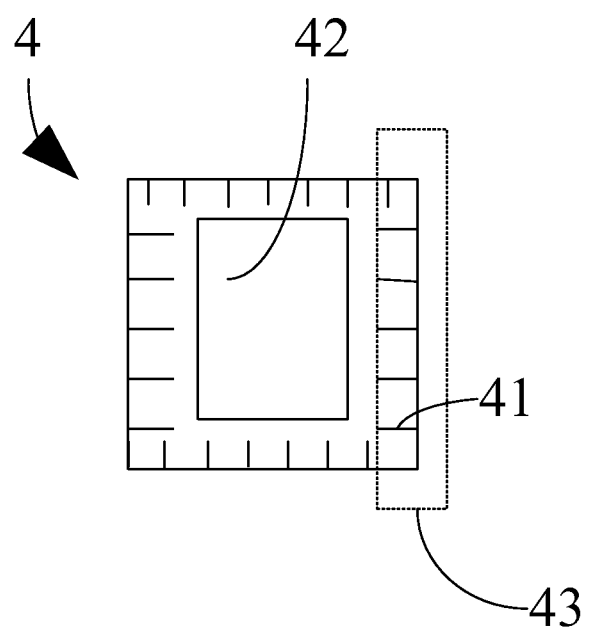
FIG. 5 is a schematic structural diagram showing a photo mask of a color filter substrate based on a second embodiment of the present invention.

Otherwise, the structure of the photo mask 2 of the color filter substrate 1 is shown in FIG. 5. FIG. 5 is a schematic structural diagram showing a photo mask of a color filter substrate based on a second embodiment of the present invention, where similar with the photo mask 2 in FIG. 4, the photo mask 4 also comprise a light shielding region 41 and a transmission region 42 surrounded by the light shielding region 41. A spaced shading pattern is disposed in an edge of the light shielding region 41 near the transmission region 42 to form a semi-transparent gray scale mask area 43. The shading pattern is a rectangular shape, a triangular shape, a trapezoidal shape or a semicircular shape. FIG. 5 is the example of a rectangular shape for the present invention. Comparing with the photo mask 2 of FIG. 4, the gray scale mask area 43 of the photo mask 4 is disposed at the surrounding area of the light shielding region 41. It should be emphasized that no matter what the gray scale mask area 43 disposed at the surrounding area of the light shielding region 41, or at opposites sides of the light shielding region 21, the left-and-right or top-and-bottom adjacent color resists 14 are different color resists relative to the pixel photo mask of the patterning process which is used in the edge of the adjacent color resists 14.

FIG. 4 is used as an example for the photo mask 2. The color resist layer 14 is exposed by the light emitted from the light source 3, where the gray scale mask area 23 is the overlapping region 15 relative to the color resist layer 14.

S14: Developing the color resist layer 14 after exposing to form a color resist pattern. The color resist layer 14 after exposing is developed. Because the overlapping region 15 of the arbitrary adjacent color resist layer 14 relative to the gray scale mask area is form into be semi-exposure structure in the previous step of the manufacturing process, the thickness of the area of the color resist pattern after developed relative to the gray scale mask area 23 is gradually thinning in its edge direction. It means that the thickness of the overlapping region 13 of the two arbitrary color resist patterns 12 is gradually thinning in its edge direction.

Thus, in the R→G→B yellow light manufacture process, the edge of the color resist layer 14 is semi-exposed by using the semi-transparent pattern of the fine gray scale mask area 23 to make the edge area of the color resist layer be thinning, so that the horn section that the color resists overlap in the overlapping region of the adjacent color resists is obviously reduced. Through the advanced optimized design, the RGB color resist layer 14 has the ideal flat effect, the performance of the liquid crystals is improved, the traditional OC flat layer is omitted and its material is saved, and the productivity is improved.

In summary, comparing with the conventional art, the photo mask of the color filter substrate of the present invention used in the display comprises the light shielding region and the transmission region surrounded by the light shielding region. The spaced shading pattern is disposed at the edge area of the light shielding region near the transmission region of form a semi-transparent gray scale mask area. The color resist layer on the main body of the color filter substrate is exposed by using the photo mask to make the thickness of the bottom color resist pattern in the overlapping region of the adjacent color resist patterns of the color filter substrate be gradually thinning along its edge direction. The horn section in the overlapping region of the adjacent color resist patterns is reduced. The performance of the liquid crystals is improved The OC flat layer does not need to be built on the color resist pattern. The production cost of the liquid crystal display device is reduced and the productivity is improved.

The above-described embodiments of the invention only, and not to limit the patent scope of the present invention, therefore, the use of all contents of the specification and drawings of the present invention is made equivalent structures or equivalent conversion process, either directly or indirectly in the other the relevant art, are included within the same reason the patent scope of the present invention.

What is claimed is:

1. A color filter substrate for a display, wherein the color filter substrate comprises a main body with a black array layer and a plurality of color resist patterns disposed on the main body with the black array layer;
    the plurality of color resist patterns comprises a first color resist pattern, a second color resistor pattern and a third color resistor pattern sequentially formed in contact with the main body and in contact with the black array layer;
    wherein each of the plurality of color resist patterns comprise a surface facing away from the main body;
    wherein the first color resist pattern and the second color resist pattern partially overlap to form a first overlapping region with the first color resist pattern below the second color resist pattern in the first overlapping region, and a thickness of the first color resist pattern in the first overlapping region is thinning in an edge direction towards the second color resist pattern;
    wherein the second color resist pattern and the third color resist pattern partially overlap to form a second overlapping region with the second color resist pattern below the third color resist pattern in the second overlapping region, and a thickness of the second color resist pattern in the second overlapping region is thinning in an edge direction towards the third color resist pattern;
    wherein the surfaces of the plurality of color resist patterns facing away from the main body are flat and there is no overcoat flat layer formed on the plurality of color resistor patterns.

2. The color filter substrate as claimed in claim 1, wherein the thickness of the bottom first color resist pattern is an arc transition in an edge of the first color resist pattern.

3. A method of manufacturing a color filter substrate for a display, wherein the color filter substrate comprises a first color resist pattern, a second color resistor pattern and a third color resist pattern sequentially formed in contact with a main body;
    the first color resist pattern, the second color resist pattern, and the third color resist pattern each comprise a surface facing away from the main body;
    the first color resist pattern and the second color resist pattern partially overlap to form a first overlapping region with the first color resist pattern below the second color resist pattern in the first overlapping region, and a thickness of the first color resist pattern in the first overlapping region is thinning in an edge direction towards the second color resist pattern;
    the second color resist pattern and the third color resist pattern partially overlap to form a second overlapping region with the second color resist pattern below the third color resist pattern in the second overlapping region, and a thickness of the second color resist pattern in the second overlapping region is thinning in an edge direction towards the third color resist pattern;
    wherein the surfaces of the plurality of color resist patterns facing away from the main body are flat and there is no overcoat flat layer formed on the plurality of color resistor patterns;
    the method comprises:
    providing the main body;
    coating a color resist layer on and in contact with the main body;
    exposing the color resist layer by a photo mask, wherein the photo mask comprises a light shielding region and a transmission region surrounded by the light shielding area, and a spaced shading pattern being disposed in an edge of the light shielding region near the transmission region to form a semi-transparent gray scale mask area;
    developing the color resist layer after exposing to obtain a color resist pattern,
    wherein thickness of the color resist pattern corresponding to the gray scale mask area is gradually thinning in an edge direction of the color resist pattern such that the color resist pattern is as the first color resist pattern or the second color resist pattern.

4. The method claimed in claim 3, wherein the gray scale mask area is disposed in opposite sides of the light shielding region to make thickness of the opposite sides of the color resist pattern corresponding to the gray scale mask area be thinning in an direction of the color resistor pattern.

5. The method claimed in claim 3, wherein the gray scale mask area is disposed at a surrounding area of the light shielding area, to make thickness of an surrounding area of the color resist pattern corresponding to the gray scale mask area be thinning in an direction of the color resist pattern.

6. The method claimed in claim 3, wherein the shading pattern is a rectangular shape, a triangular shape, a trapezoidal shape or a semicircular shape.

7. The color filter substrate as claimed in claim 1, wherein the first color resist pattern, the second color resist pattern and the third color resist pattern are a red resist pattern (R), a green resist pattern (G) and a blue resist pattern (B) respectively.

8. The method claimed in claim 3, wherein the first color resist pattern, the second color resist pattern and the third color resist pattern are a red resist pattern (R), a green resist pattern (G) and a blue resist pattern (B) respectively.

* * * * *